United States Patent
Dono (10) Patent No.: US 7,457,176 B2
(45) Date of Patent: Nov. 25, 2008

(54) SEMICONDUCTOR MEMORY AND MEMORY MODULE

(75) Inventor: Chiaki Dono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 154 days.

(21) Appl. No.: 11/617,379

(22) Filed: Dec. 28, 2006

(65) Prior Publication Data

US 2008/0089167 A1 Apr. 17, 2008

(30) Foreign Application Priority Data

Oct. 12, 2006 (JP) ............................. 2006-278470

(51) Int. Cl.
*G11C 7/00* (2006.01)
(52) U.S. Cl. .................. 365/193; 365/191; 365/201; 365/230.06
(58) Field of Classification Search ................. 365/193, 365/191, 201, 230.06
See application file for complete search history.

(56) References Cited

U.S. PATENT DOCUMENTS 5,777,942 A * 7/1998 Dosaka et al. ......... 365/230.03
6,151,269 A * 11/2000 Dosaka et al. ......... 365/189.17
6,347,063 B1 * 2/2002 Dosaka et al. ......... 365/189.17
6,421,789 B1 7/2002 Ooishi
6,714,471 B2 * 3/2004 Kono ..................... 365/189.15
6,731,553 B2 * 5/2004 Fujioka et al. ............. 365/201
6,894,945 B2 * 5/2005 Sawada ................. 365/233.11

FOREIGN PATENT DOCUMENTS

JP 2000-215693 A 8/2000

* cited by examiner

*Primary Examiner*—Viet Q. Nguyen
(74) *Attorney, Agent, or Firm*—Sughrue Mion, PLLC (57) ABSTRACT

A semiconductor memory is provided in which a verification result of a circuit operation in a test mode can be output from a memory module complying with the FB-DIMM even if the semiconductor memory is mounted on the memory module. The semiconductor memory includes: a command decoding section that decodes a command to start a read mode in which stored data is output or a test mode in which a predetermined circuit operation is executed and then an execution result thereof is output; a signal generating section that, based on the decoded command, generates a first or second data strobe signal showing an output timing of the stored data or the execution result; and a data-strobe-signal outputting section that outputs the first data strobe signal to an external terminal in the read mode and that outputs the second data strobe signal to the external terminal in the test mode.

10 Claims, 9 Drawing Sheets

SEMICONDUCTOR MEMORY AND MEMORY MODULE

BACKGROUND OF THE INVENTION

1. Field of the Invention

The present invention relates to a semiconductor memory such as a DRAM (Dynamic Random Access Memory), and, more particularly, to a semiconductor memory suitable for a memory module complying with the FB-DIMM (Fully-Buffered Dual In-line Memory Module) standard.

Priority is claimed on Japanese Patent Application No. 2006-278470 filed on Oct. 12, 2006, the content of which is hereby incorporated by reference.

2. Description of Related Art

With the development of fine processing technology, an attempt has been diligently made to enlarge the capacity of a semiconductor memory typified by a DRAM. Generally, in order to improve the yield of products, the semiconductor memory has a redundant circuit including spare rows (redundant rows) and spare columns (redundant columns) used for defect relief (i.e., used for aid to defects). Addresses to be replaced by the spare rows and the spare columns are programmed into a fuse circuit.

This type of semiconductor memory includes a roll-call function to determine whether a redundant circuit is being used and a verify function to verify whether addresses for defect relief have been correctly set in the fuse circuit, both of which serve as functions in a test mode. The use of the test mode makes it possible to easily verify the operation of the redundant circuit. Verification results obtained in the test mode are output to an outer device through a data terminal (DQ terminal).

Figure 8A:
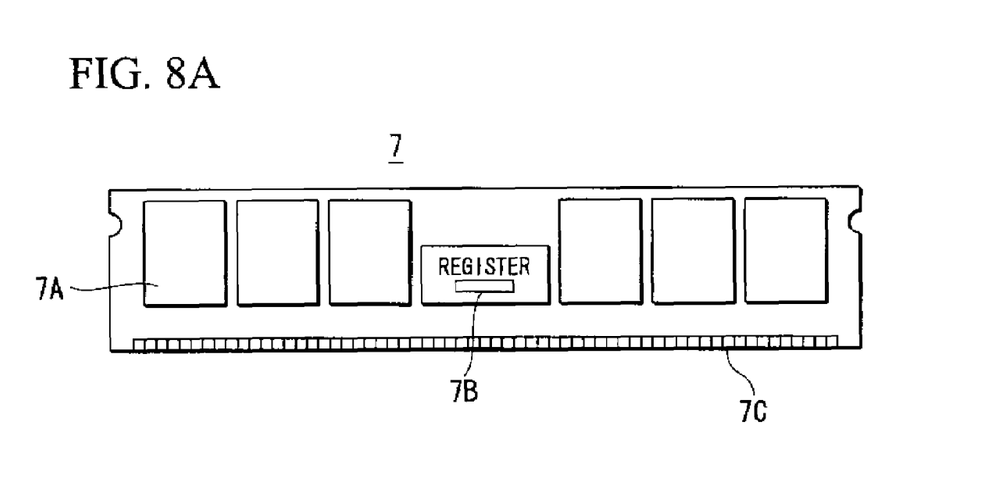
FIG. 8A is an explanatory drawing for explaining a memory module complying with the R-DIMM standard.
Figure 8B:
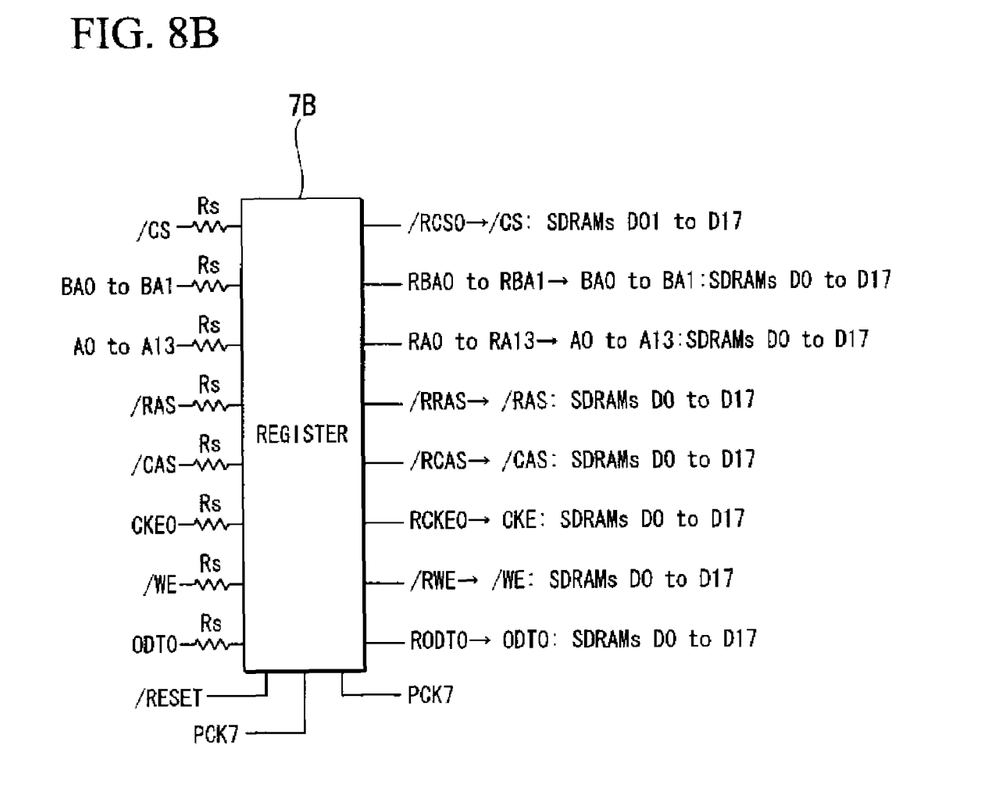
FIG. 8B is an explanatory drawing for explaining a register provided in the memory module shown in FIG. 8A, through which input signal terminals of a semiconductor memory provided in the memory module are connected to an electrode of the memory module.

A memory module complying with the R-DIMM (Registered DIMM) standard or the U-DIMM (Unregistered DIMM) standard is known as a memory module composed of a plurality of semiconductor memories. The whole structure of a memory module 7 complying with the R-DIMM standard is shown in FIG. 8A. In this figure, reference symbol 7A designates a semiconductor memory (DRAM), reference symbol 7B designates a register, and reference symbol 7C designates an electrode of the memory module 7. In this example, six semiconductor memories 7A are mounted on the memory module 7. As is understood from FIG. 5B, input signal terminals of the semiconductor memory 7A are connected to the electrode 7C through the register 7B, whereas output signal terminals of the semiconductor memory 7A are connected directly to the electrode 7C without passing through the register 7B.

This R-DIMM standard employs a stub type as a mode for the connection of a channel signal line (i.e., an external signal line connected to the electrode 7C of the memory module 7). Therefore, if the number of memory modules per channel is increased, a capacity associated with the channel signal line is enlarged, and, in addition, noise on the channel signal line is enlarged. Therefore, a high-speed type semiconductor memory having only a slight timing margin has a problem in the fact that a delay and deterioration in a channel signal are caused. As a result, the number of memory modules per channel is restricted, and, disadvantageously, this restriction causes a bottleneck in improving the performance of a server system that needs high-speed and high-capacity semiconductor memories. The same problem arises in a semiconductor memory complying with the U-DIMM standard.

Consequently, in recent years, correspondingly to an increase in data transfer rate of a system and an increase in capacity thereof, the FB-DIMM standard has been promoted by JEDEC (Joint Electron Device Engineering Council) so as to serve as a new standard according to which the problems mentioned above are overcome. A high-speed memory module complying with this FB-DIMM standard has been proposed.

Figure 9A:
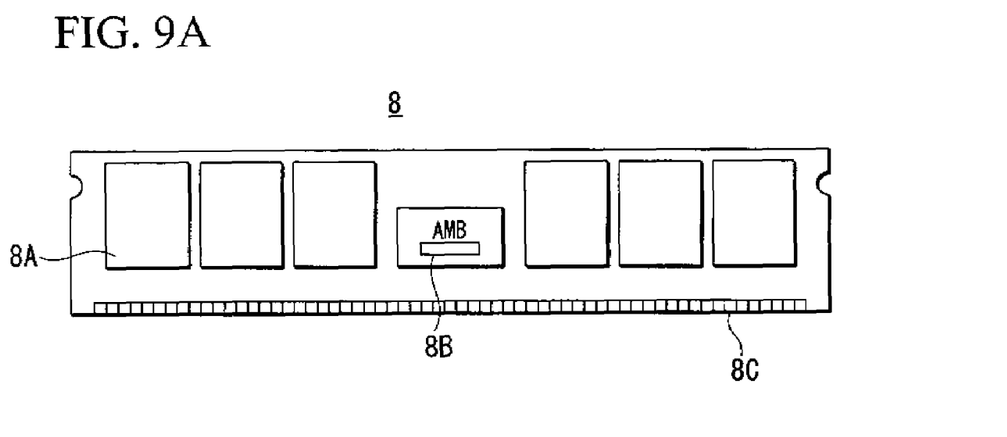
FIG. 9A is an explanatory drawing for explaining a memory module complying with the FB-DIMM standard.
Figure 9B:
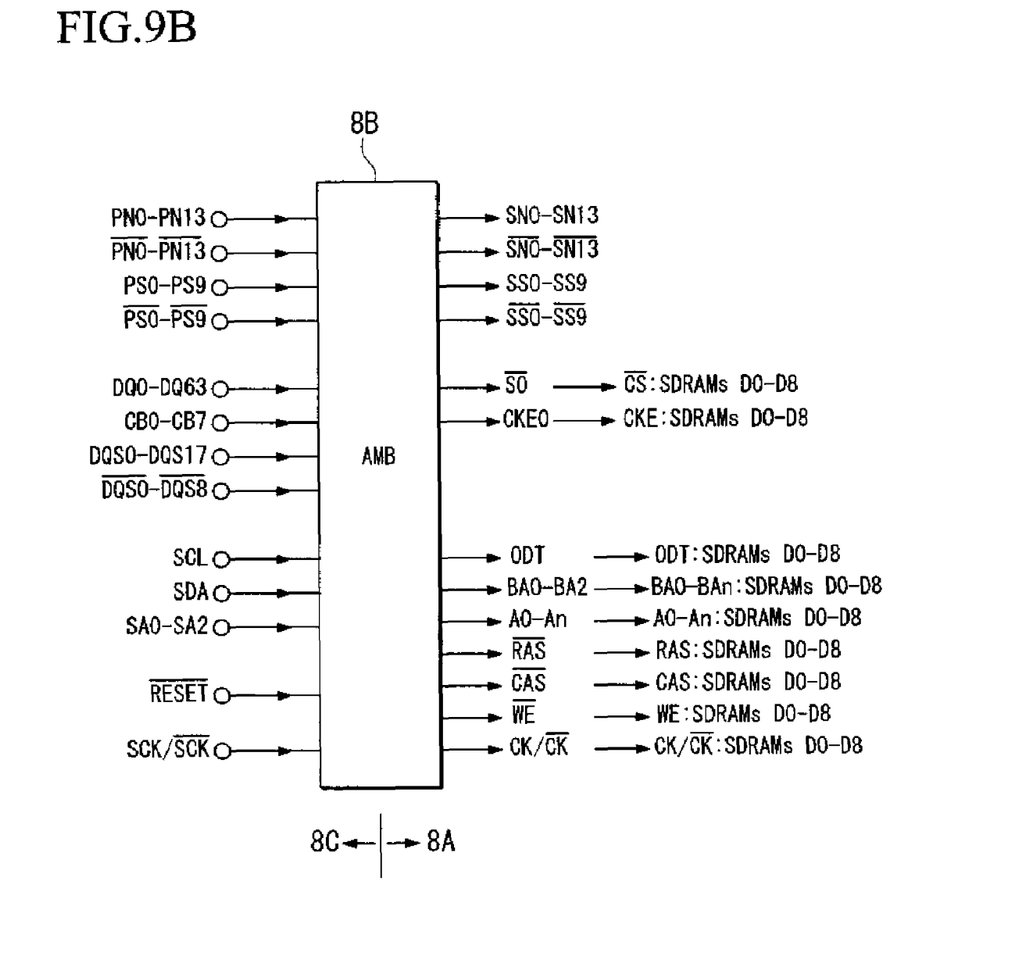
FIG. 9B is an explanatory drawing for explaining a buffer provided in the memory module shown in FIG. 9A, through which all signal terminals of a semiconductor memory provided in the memory module are connected to an electrode of the memory module.

FIG. 9A shows the whole structure of a memory module 8 complying with the FB-DIMM standard. In this figure, reference symbol 8A designates a semiconductor memory (DRAM), reference symbol 8B designates a buffer called "AMB" (Advanced Memory Buffer), and reference numeral 8C designates an electrode of the memory module 8. In this example, six semiconductor memories 8A are mounted on the memory module 8. As is understood from FIG. 9B, all signal terminals of the semiconductor memory 8A are connected to the electrode 8C through the buffer 8B. Thus, the timing margin of the semiconductor memory 8A is secured by buffering all signals by use of the buffer 8B.

Additionally, the FB-DIMM standard employs a point-to-point connection method (serial connection method) as a mode for the connection of the channel signal line. Therefore, even if the number of memory modules per channel is increased, the capacity of the channel signal line through which modules are connected together comes to a fixed amount, and noise on the channel signal line is restrained. As a result, a delay and deterioration in a channel signal are improved, thus making it possible to fully utilize the characteristics of a high-speed type semiconductor memory having only a slight timing margin and to allow the semiconductor memory to perform an ultrahigh-speed operation.

However, a problem with a conventional semiconductor memory is that the roll-call function and the verify function cannot be used if the conventional semiconductor memory is incorporated into a memory module complying with the FB-DIMM standard.

In more detail, when data is output in an ordinary read mode, a semiconductor memory developed in recent years outputs a data strobe signal together with the data. On the system side, the output timing of the data is determined by referring to the data strobe signal, so that this data can be exactly obtained. When the thus structured semiconductor memory is incorporated into a memory module of the FB-DIMM standard, all signals including the data are targeted to be buffered by the AMB mentioned above. Therefore, when data is output, the semiconductor memory is required to simultaneously output a data strobe signal regardless of the operation mode.

Figure 10:
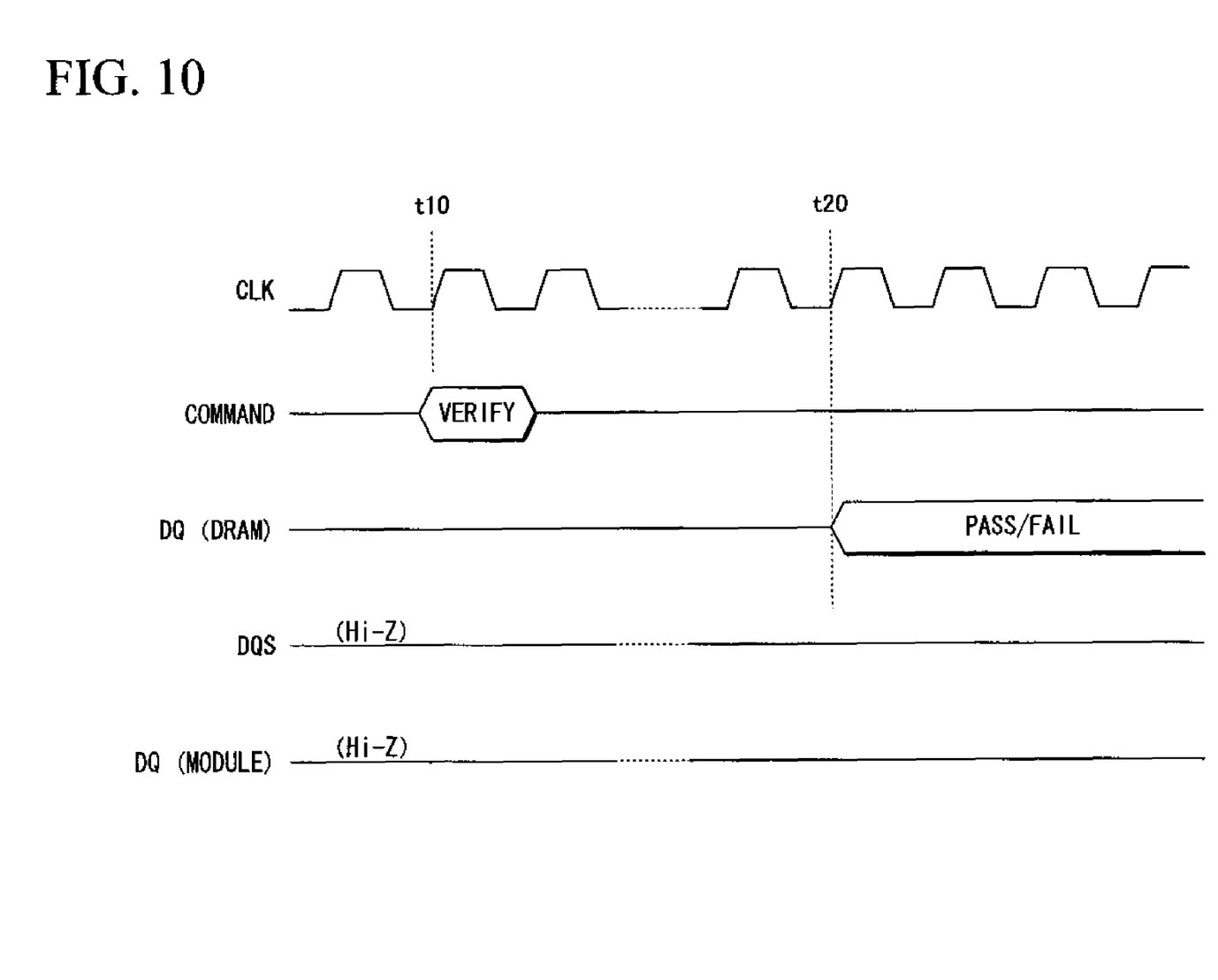
FIG. 10 is a timing chart for explaining an operation of a semiconductor memory according to a conventional technique.

However, the conventional semiconductor memory cannot output a data strobe signal in a test mode. In more detail, when a command that starts the verify function is given to a semiconductor memory as a test mode at time t10 as shown in FIG. 10, its verification result is output from the semiconductor memory as data DQ at time t20. However, a data strobe signal DQS is not output, and a high-impedance state is maintained. Therefore, the data DQ is not buffered in the AMB of the memory module, so that the data DQ cannot be output from the memory module.

Therefore, even if the test mode (e.g., the roll-call function, verify function) is started, its verification result cannot be output from the memory module. After all, the circuit operation of the semiconductor memory cannot be verified by the test mode.

SUMMARY OF THE INVENTION

The present invention has been made in consideration of the foregoing circumstances. It is therefore an object of the present invention to provide a semiconductor memory in which a circuit operation can be verified by a test mode even if the semiconductor memory is mounted on a memory module complying with the FB-DIMM, and provide a memory module composed of these semiconductor memories.

The semiconductor memory of the present invention includes: a command decoding section that decodes a command to start a read mode in which stored data is output or a command to start a test mode in which a predetermined circuit operation is executed and then an execution result of the predetermined circuit operation is output; a signal generating section that, based on the command decoded by the command decoding section, generates a first data strobe signal showing an output timing of the stored data or a second data strobe signal showing an output timing of the execution result of the predetermined circuit operation; and a data-strobe-signal outputting section that outputs the first data strobe signal to an external terminal in the read mode and that outputs the second data strobe signal to the external terminal in the test mode.

According to this structure, since a data strobe signal (i.e., the second data strobe signal) is generated and output in the test mode, a circuit operation thereof can be verified by the test mode even if the semiconductor memories are mounted on the memory module complying with the FB-DIMM.

The data-strobe-signal outputting section may include an arithmetic section that calculates a logical OR of the first data strobe signal and the second data strobe signal. Alternatively, the data-strobe-signal outputting section may include a selector that selects either the first data strobe signal or the second data strobe signal in accordance with whether an operation mode is the read mode or the test mode.

According to this structure, in the test mode, the second data strobe signal showing an output timing of an execution result of a predetermined circuit operation is output by allowing the calculation of a logical OR to be made together with the first data strobe signal, and hence the output timing of data showing an execution result of the circuit operation can be determined. Therefore, even if the semiconductor memories are mounted on the memory module complying with the FB-DIMM, the circuit operation thereof in the test mode can be verified.

The semiconductor memory may further include a fuse circuit used to store data that defines a circuit structure of the semiconductor memory, and the predetermined circuit operation may be an operation with which the fuse circuit is involved.

In the semiconductor memory, the fuse circuit may be used to store an address for defect relief, and the predetermined circuit operation may be at least one of an operation that reads the address for defect relief from the fuse circuit and then outputs the address for defect relief and an operation that verifies whether the address for defect relief has been correctly set in the fuse circuit.

A memory module of the present invention complies with an FB-DIMM standard, and includes the semiconductor memories mentioned above.

DETAILED DESCRIPTION OF THE INVENTION

An embodiment of the present invention will be hereinafter described with reference to the attached drawings.

Figure 1:
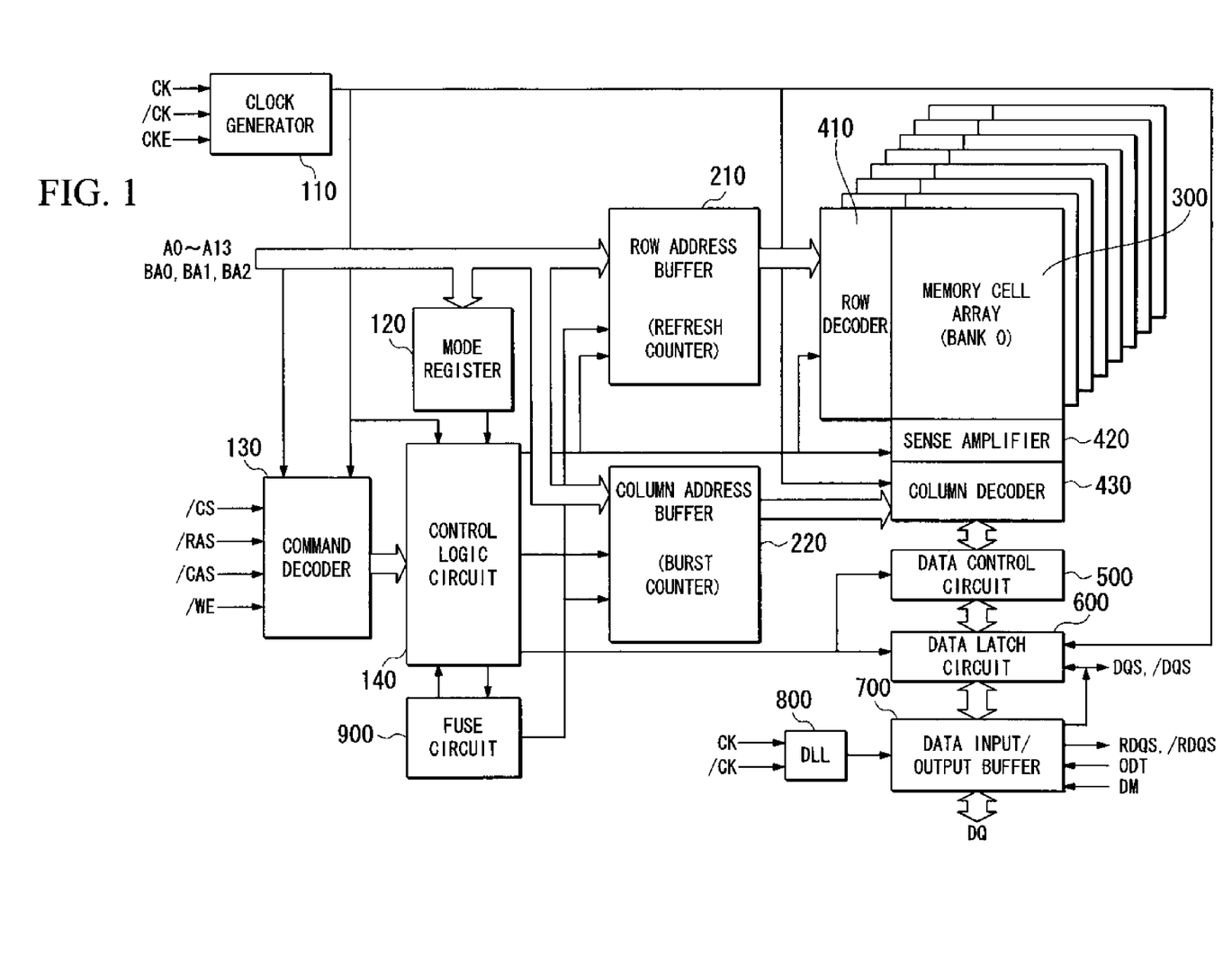
FIG. 1 is a block diagram of a semiconductor memory according to an embodiment of the present invention.

FIG. 1 shows the whole structure of a semiconductor memory according to an embodiment of the present invention. This semiconductor memory is a DRAM, and is structured to output a data strobe signal together with stored data at least in a read mode. In FIG. 1, reference symbol 110 designates a clock generator, reference symbol 120 designates a mode register, reference symbol 130 designates a command decoder, reference symbol 140 designates a control logic circuit, reference symbol 210 designates a row address buffer, reference symbol 220 designates a column address buffer, reference symbol 300 designates a memory cell array, reference symbol 410 designates a row decoder, reference symbol 420 designates a sense amplifier, reference symbol 430 designates a column decoder, reference symbol 500 designates a data control circuit, reference symbol 600 designates a data latch circuit, reference symbol 700 designates a data I/O buffer, reference symbol 800 designates a delayed locked loop (DLL), and reference symbol 900 designates a fuse circuit used to store addresses for defect relief. In a test mode, the semiconductor memory executes a predetermined circuit operation, such as a verify operation or a roll-call operation, in which the fuse circuit 900 is involved, and outputs its execution result.

The clock generator 110 generates an internal clock signal based on clock signals CK and /CK and a clock enable signal CKE to be input from the outside. Note that the symbol "/" represents that a signal to which this symbol has been attached is an inverted signal. This internal clock signal is distributed into the command decoder 130, the control logic circuit 140, the column decoder 430, and the data latch circuit 600, and serves as a criterion of operation timing of each circuit.

The mode register 120 stores various operation parameters, such as the length of a burst (burst length) or latency. The operation parameters are input from the outside via address signals A0 to A13. The command decoder 130 decodes an operation command, such as a read command or a write command. The operation command is input from the outside while using a chip select signal /CS, a row address strobe signal /RAS, a column address strobe signal /CAS, and a write enable signal /WE.

Likewise, a special command to start the test mode of the semiconductor memory is decoded by the command decoder 130.

The control logic circuit 140 generates various signals to execute an operation command decoded by the command decoder 130.

The row address buffer 210 serves to input a row address signal to select a row of the memory cell array 300, which is included in bank address signals BA0, BA1, and BA2 and address signals A0 to A13 input from the outside. The row address buffer 210 includes a refresh counter that advances a row address step by step in a refresh operation.

The column address buffer 220 serves to input a column address signal to select a column of the memory cell array 300, which is included in the bank address signals BA0, BA1, and BA2 and the address signals A0 to A13 input from the outside. The column address buffer 220 includes a burst counter that counts the length of a burst.

The memory cell array 300 is structured by arranging memory cells in matrix form. A plurality of word lines are laid in the row direction of the memory cell array 300, whereas a plurality of bit lines are laid in the column direction thereof. A memory cell is placed at an intersection of a word line and a bit line. Each memory cell is uniquely selected by selecting the word line and the bit line. Based on a row address signal output from the row address buffer 210, the row decoder 410 uniquely selects the word line in the memory cell array 300.

The sense amplifier 420 amplifies a faint data signal emitted from a memory cell appearing on the bit line of the memory cell array 300. The column decoder 430 selects the bit line of the memory cell array 300.

In this example, the memory cell array 300, the row decoder 410, and the sense amplifier 420 are provided for each of the banks. Each bank is selected by the bank address signals BA0, BA1, and BA2.

The data control circuit 500 controls the order of output of data that has been read from the memory cell array 300 in the burst mode. The data latch circuit 600 temporarily stores input data and output data. Herein, reference symbols DQS and /DQS denote a data strobe signal. The data I/O buffer 700 outputs and inputs data DQ to and from an external terminal. The DLL 800 delays external clock signals CK and /CK, and generates an internal clock signal that determines the operation timing of the data I/O buffer 700. Reference symbols RDQS and /RDQS denote a data strobe signal used for a read operation, reference symbol ODT (On Die Termination control) denotes a signal used to control the validity/invalidity of a terminating resistor in the semiconductor memory and input from the outside, and reference symbol DM denotes an input mask signal used for write data and input from the outside.

The fuse circuit 900 stores data by which various circuit structures are defined, such as data that defines a circuit structure relative to a redundant configuration for defect relief, data that defines a circuit structure relative to a word organization of output data, data that defines a circuit structure relative to an internal power-supply voltage, or data that defines a circuit structure relative to operation timing of an internal circuit. In this embodiment, the fuse circuit 900 is formed of anti-fuses. However, without being limited to this, the fuse circuit 900 may use any type of fuse element.

Figure 2:
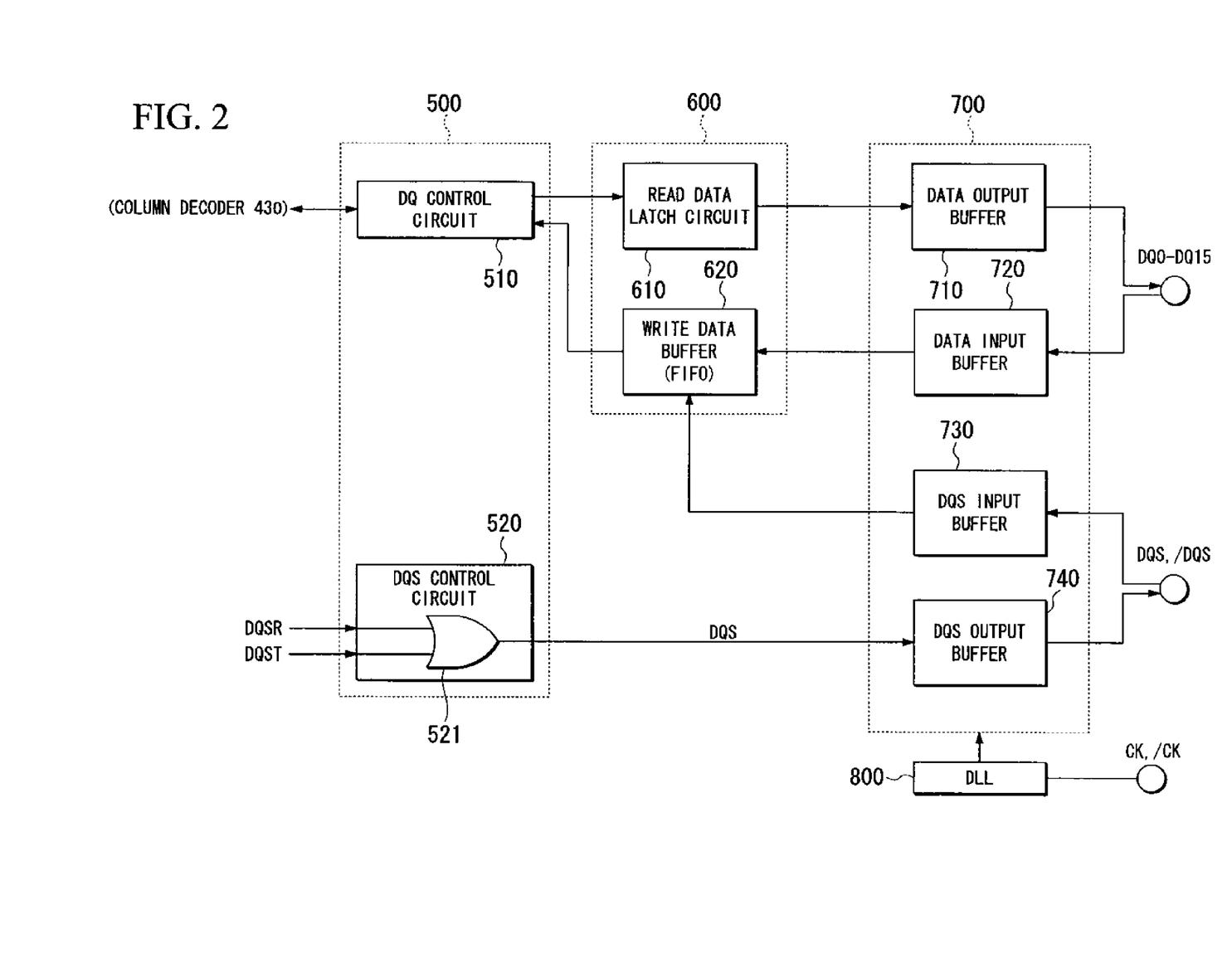
FIG. 2 is a detailed block diagram showing a data control circuit, a data latch circuit, and a data I/O (input/output) buffer that are included in the semiconductor memory according to the embodiment.

FIG. 2 shows a detailed structure of the data control circuit 500, the data latch circuit 600, and the data I/O buffer 700.

As shown in FIG. 2, the data control circuit 500 is composed of a DQ control circuit 510 and a DQS control circuit 520. The DQ control circuit 510 controls the order of output of data read from the memory cell array 300 via the column decoder 430 as described above. On the other hand, the DQS control circuit 520 is one of the characterizing parts of this semiconductor memory, and consists of a logical OR-gate circuit 521. The DQS control circuit 520 calculates the logical OR of a data strobe signal DQSR (first data strobe signal) in the read mode and a data strobe signal DQST (second data strobe signal) in the test mode, and outputs the data strobe signal DQSR or the data strobe signal DQST as the data strobe signal DQS. The data strobe signals DQSR and DQST are generated by the control logic circuit 140 shown in FIG. 1.

The data latch circuit 600 is composed of a read data latch circuit 610 and a write data buffer (FIFO (First In First Out)) 620. The read data latch circuit 610 latches data output from the data control circuit 500 in the read mode. On the other hand, the write data buffer 620 temporarily stores data input from the outside in the write mode. Data stored in the write data buffer 620 is written to the memory cell array 300 via the data control circuit 500.

The data I/O buffer 700 is composed of a data output buffer 710, a data input buffer 720, a DQS input buffer 730, and a DQS output buffer 740. The data output buffer 710 outputs data latched by the read data latch circuit 610 to an external terminal in the read mode. The data input buffer 720 receives data from the external terminal, and outputs the data to the write data buffer 620 in the write mode. The read data latch circuit 610 and the data output buffer 710 are also used to output data showing verification results in the test mode.

The DQS input buffer 730 receives a data strobe signal DQS from the outside in the write mode. The DQS output buffer 740 outputs a data strobe signal DQS output from the DQS control circuit 520 to the external terminal in the read mode (or, alternatively, the test mode). This data strobe signal is treated as a criterion for inputting/outputting all data. The data I/O buffer 700 inputs or outputs data at an appropriate timing while synchronizing with an internal clock signal input from the DLL 800.

The DQS control circuit 520 and the DQS output buffer 740 function as a data-strobe-signal outputting section that outputs a data strobe signal DQSR to an external terminal in the read mode, and outputs a data strobe signal DQST to the external terminal in the test mode. This function of the data-strobe-signal outputting section is one of the important structural elements of the semiconductor memory, like the function of the control logic circuit 140, described later, by which the data strobe signal DQST is generated.

Next, the operation of the semiconductor memory will be described paying attention to the data strobe signal DQS.

Figure 3:
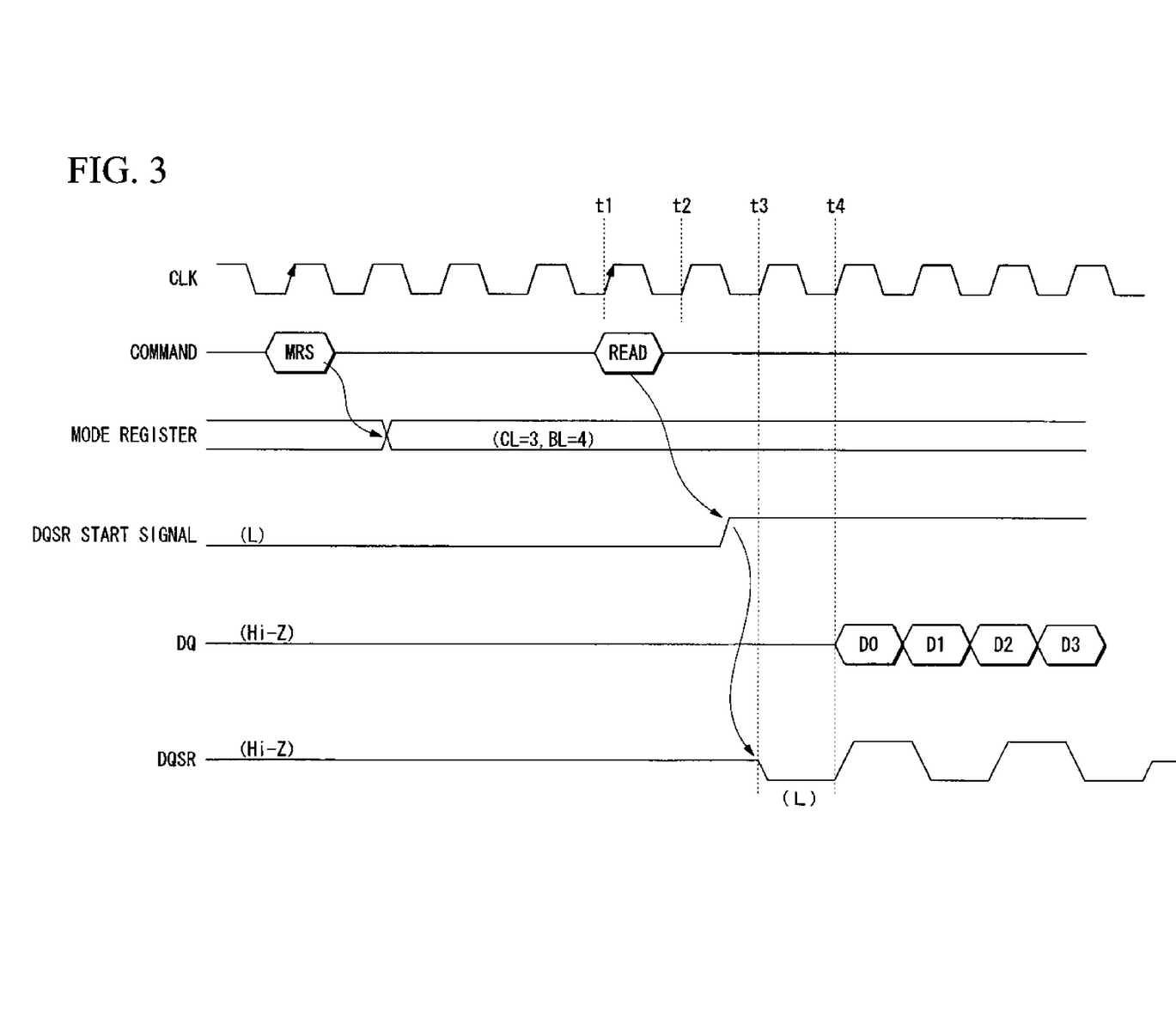
FIG. 3 is a timing chart for explaining an operation (i.e., a read mode) of the semiconductor memory according to the embodiment.

First, referring to FIG. 3, a description will be given of a case in which data is read by an ordinary read command in the read mode. In this case, operation parameters, such as latency or burst length, are preset in the mode register 120 by a mode register setting command (MRS command). In this embodiment, the CAS latency (CL) is set at "3" and the burst length (BL) is set at "4". The set values of the mode register 120 are kept unchanged until resetting is performed or until the power source is turned off.

Thereafter, when a read command (READ command) is input subsequently to an active command (ACT command; not shown in the figure), the read command is taken into the command decoder 130 at the rising edge of a clock signal CLK (i.e., an internal clock signal generated from the external clock signals CK and /CK, and the clock enable signal CKE in the clock generator 110) at time t1, and is decoded. Based on a result obtained by the decoding, the control logic circuit 140 outputs various control signals required for a read operation. In response to these control signals, the row address buffer 210 and the column address buffer 220 receive address signals A0 to A13 and bank address signals BA0, BA1, and BA2, whereas the row decoder 410 and the column decoder 430 respectively select a word line and a bit line in the memory cell array 300, thereby reading stored data from the memory cell array 300.

Data read from the memory cell array 300 is subjected to the control of output order by the DQ control circuit 510 shown in FIG. 2, and is then latched by the read data latch circuit 610. At time t4, i.e., after a fixed time, which is determined by the CAS latency (CL=3) beforehand, has elapsed from when the read command (READ command) is input, the data output buffer 710 outputs data D0, D1, D2, and D3 (BL=4), which have been latched by the read data latch circuit 610, as data DQ to an external terminal at regular time intervals and continuously.

In this series of read operations, the control logic circuit 140 shown in FIG. 1 generates a high-level DQSR start signal after a fixed period based on the rising edge of the clock signal CLK, i.e., at time t1, into which the read command (READ command) has been taken. Thereafter, the data strobe signal DQSR is set to be a low level at the rising edge of the clock signal CLK, i.e., at time t3, immediately after the DQSR start signal is changed to a high level, and the data strobe signal DQSR is toggled at regular time intervals until the read operation is completed while the rising edge of the clock signal CLK subsequent thereto, i.e., at time t4, is set as a starting point.

The data strobe signal DQSR is given to one of input ports of the DQS control circuit (i.e., the logical OR-gate circuit 521) 520 shown in FIG. 2. Here, in the read mode, a data strobe signal DQST, described later, that is input to the other one of the input ports of the DQS control circuit 520 is kept at a low level. Therefore, in the read mode, a data strobe signal DQSR output from the control logic circuit 140 passes through the DQS control circuit 520 consisting of the logical OR-gate circuit 521, and is output through the DQS output buffer 740 to an external terminal as a data strobe signal DQS.

Accordingly, in the read mode, the data DQ and the data strobe signal DQS are output from the semiconductor memory.

Next, referring to FIG. 4, a description will be given of a case in which a verification result by the verify function is output in the test mode. In this case, the fuse circuit 900 shown in FIG. 1 is subjected to a repair process beforehand, and addresses for defect relief are set in the fuse circuit 900.

Figure 4:
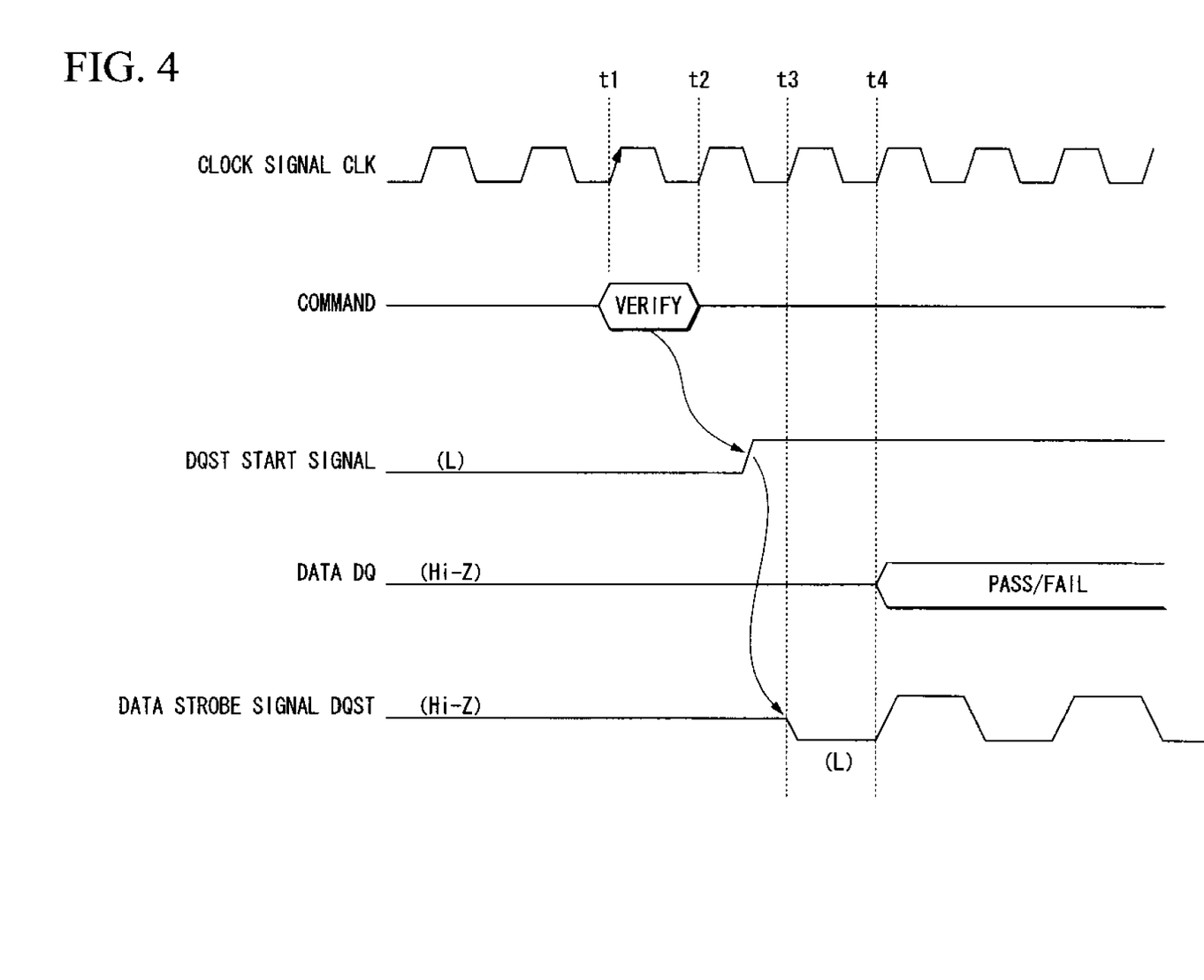
FIG. 4 is a timing chart for explaining an operation (i.e., a test mode) of the semiconductor memory according to the embodiment.

In FIG. 4, a command to start the verify function is given to the semiconductor memory, is then taken into the command decoder 130 at the rising edge of a clock signal CLK positioned at time t1, and is decoded.

Based on a result obtained by the decoding of the command decoder 130, the control logic circuit 140 outputs various control signals required for verify operations. In response to these control signals, an operation to verify whether an address for defect relief has been correctly set in the fuse circuit 900 is performed in the semiconductor memory. Data showing this verification result, i.e., data (PASS or FAIL) showing whether an address for defect relief has been correctly set in the fuse circuit 900 is latched by the read data latch circuit 610. The data output buffer 710 outputs this latched data to an external terminal.

In this series of verify operations, the control logic circuit 140 shown in FIG. 1 generates a high-level DQST start signal after a fixed period based on the rising edge of the clock signal CLK, i.e., at time t1, into which the verify command has been taken. Thereafter, the data strobe signal DQST, which has been in a high-impedance state (i.e., a Hi-Z state) up to that time, is forcedly set to be a low level at the rising edge of the clock signal CLK, i.e., at time t3, immediately after the DQST start signal is changed to a high level, and the data strobe signal DQST is toggled at regular time intervals until the verify operation is completed. This data strobe signal DQST is input to the other one of the input ports of the DQS control circuit 520 shown in FIG. 2.

Here, in the test mode, the data strobe signal DQSR input to one of the input ports of the DQS control circuit 520 in the read mode is fixed at a low level. Therefore, in the test mode, the data strobe signal DQST output from the control logic circuit 140 passes through the DQS control circuit 520 consisting of the logical OR-gate circuit 521, and is output through the DQS output buffer 740 to an external terminal as a data strobe signal DQS.

Accordingly, in the test mode, a data strobe signal DQS is output from the semiconductor memory according to this embodiment together with data DQ showing verification results. Therefore, even when a memory module complying with the FB-DIMM standard is formed by use of the semiconductor memories according to this embodiment, an external system (e.g., a memory tester) can start the test mode of the semiconductor memory according to this embodiment mounted on this memory module, and can obtain verification results.

Although the verify function has been described as an example, a data strobe signal DQS can be output in the same way even when the roll-call function is used.

Figure 5:
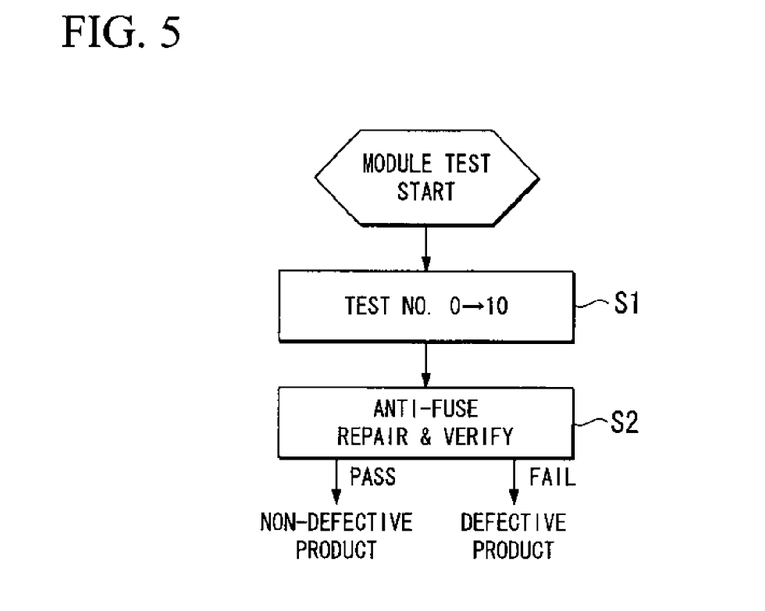
FIG. 5 is a flowchart showing an example of a test process of a memory module formed by using the semiconductor memories according to the embodiment.

Lastly, referring to FIG. 5, a description will be given of a test process of the memory module composed of the semiconductor memories according to this embodiment. Herein, the memory module complies with the FB-DIMM standard.

When a test is started, the memory tester executes test items No. 1 to No. 10 (step S1). Thereafter, in order to relieve defects, an anti-fuse element of the Rise circuit 900 is repaired based on a test result, and the test mode is started to perform a verifying operation (step S2). If this verification is passed, a non-defective product is obtained. If this verification is failed, a defective product is obtained.

Thus, according to the memory module complying with the FB-DIMM standard that is composed of the semiconductor memories according to this embodiment, the test mode can be executed, and what is required in the step of repairing the fuse circuit is to perform a verifying operation only once. Therefore, the test process can be simplified.

Figure 6:
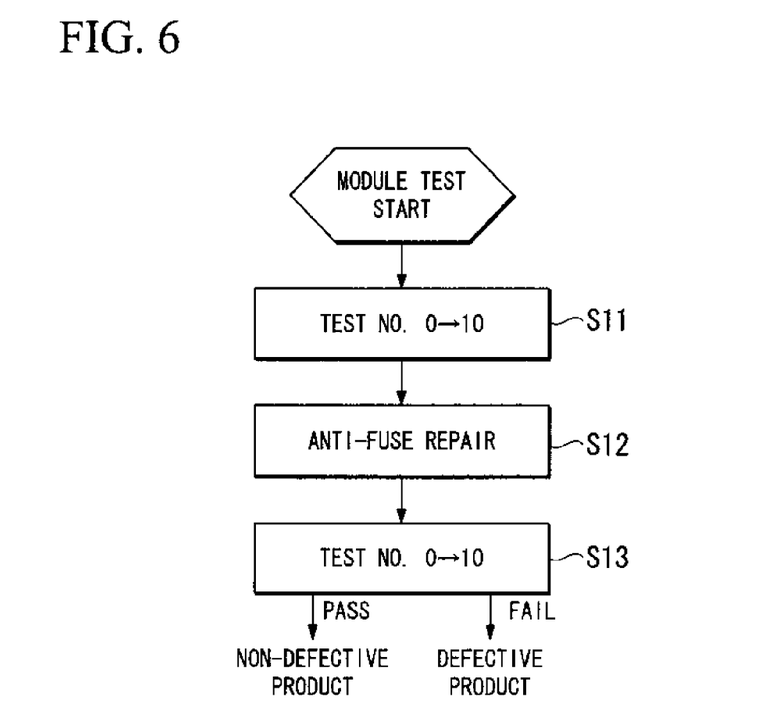
FIG. 6 is a flowchart showing an example of a test process of a memory module formed by using conventional semiconductor memories for explanation in comparison with the foregoing embodiment.

Only by way of suggestion, referring to FIG. 6, a description will be given of a test process of a memory module composed of conventional semiconductor memories.

When a test is started, the memory tester executes test items No. 1 to No. 10 (step S11). Thereafter, in order to relieve defects, an anti-fuse element of the fuse circuit 900 is repaired based on a test result (step S12). Thereafter, test items No. 1 to No. 10 are again executed, and a verification operation is conducted as to whether a normal operation is performed (step S13). If this verification is passed, a non-defective product is obtained. If this verification is failed, a defective product is obtained.

Thus, according to the memory module on which the conventional semiconductor memories are mounted, the same test must be repeatedly made twice before and after the step of repairing the fuse circuit. On the other hand, according to the semiconductor memory of this embodiment, what is required in the step of repairing the fuse circuit is to perform a verifying operation only once as mentioned above. Therefore, according to the semiconductor memory of this embodiment, the test process can be simplified, and the test time can be greatly shortened.

Although the embodiment of the present invention has been described as above, the present invention is not limited to the above embodiment. The present invention includes modifications within a range not departing from the essentials of the present invention. For example, although the roll-call function and the verify function are started in the test mode in the above embodiment, the present invention is not limited to this. The contents of the test mode are not restricted as long as a verification result is output as data DQ.

Figure 7:
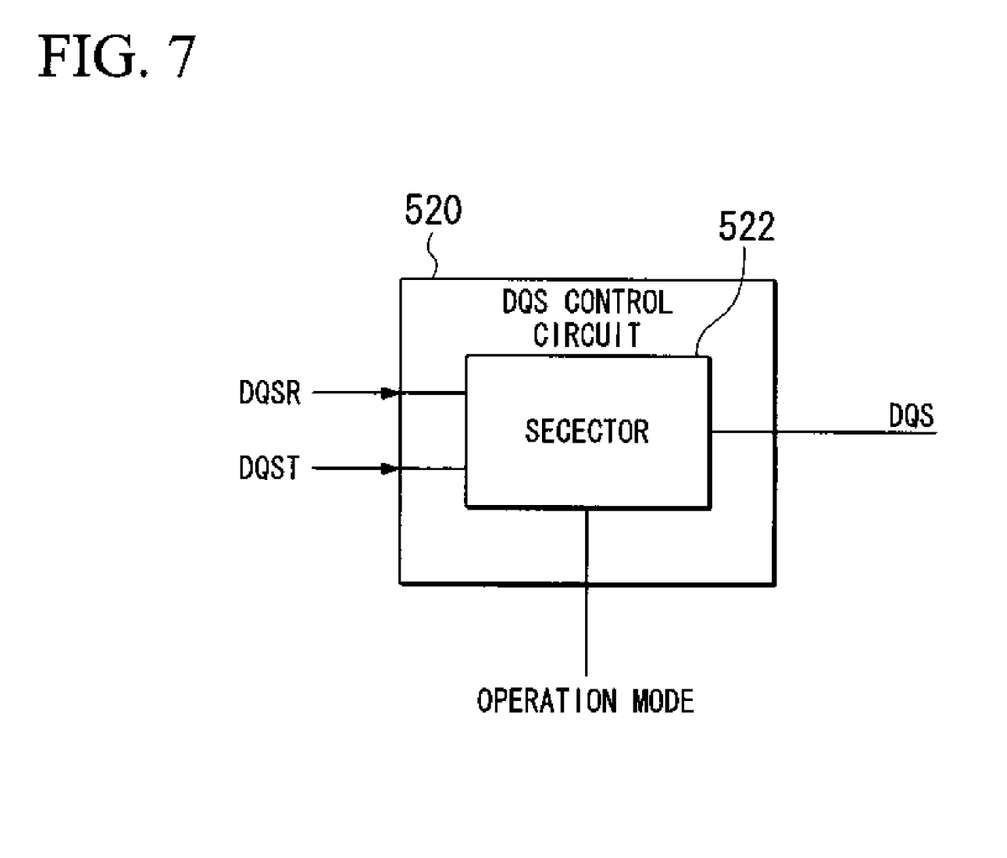
FIG. 7 is a block diagram showing another example of a DQS control circuit that consists of a selector.

Additionally, in the above embodiment, as an example, the logical OR-gate circuit 521 is used as the DQ control circuit 520. However, without being limited to this, for example, a two-input and one-output type selector 522 can be used as shown in FIG. 7. In this case, a data strobe signal DQSR (a first data strobe signal) that is output from the control logic circuit 140 in the read mode is input to one of input ports of the selector 522, whereas a data strobe signal DQST (a second data strobe signal) that is output from the control logic circuit 140 in the test mode is input to the other one of the input ports of the selector 522. Accordingly, it is recommended to perform switching between these signals in accordance with the operation mode (i.e., command).

Additionally, in the above embodiment, the circuit operation for verification in the test mode is performed to verify an operation with which the fuse circuit 900 is involved. However, the present invention is not limited to this.

Additionally, in the above embodiment, the memory module composed of the semiconductor memories according to this embodiment complies with the FB-DIMM standard. However, the present invention is not limited to this.

What is claimed is:

1. A semiconductor memory comprising:
    a command decoding section that decodes a command to start a read mode in which stored data is output or a command to start a test mode in which a predetermined circuit operation is executed and then an execution result of the predetermined circuit operation is output;
    a signal generating section that, based on the command decoded by the command decoding section, generates a first data strobe signal showing an output timing of the stored data or a second data strobe signal showing an output timing of the execution result of the predetermined circuit operation; and
    a data-strobe-signal outputting section that outputs the first data strobe signal to an external terminal in the read mode and that outputs the second data strobe signal to the external terminal in the test mode.

2. The semiconductor memory as recited in claim 1, wherein the data-strobe-signal outputting section comprises an arithmetic section that calculates a logical OR of the first data strobe signal and the second data strobe signal.

3. The semiconductor memory as recited in claim 1, wherein the data-strobe-signal outputting section comprises a selector that selects either the first data strobe signal or the second data strobe signal in accordance with whether an operation mode is the read mode or the test mode.

4. The semiconductor memory as recited in claim 1, further comprising a fuse circuit used to store data that defines a circuit structure of the semiconductor memory, wherein the predetermined circuit operation is an operation with which the fuse circuit is involved.

5. The semiconductor memory as recited in claim 4, wherein the fuse circuit is used to store an address for defect relief, and the predetermined circuit operation is at least one of an operation that reads the address for defect relief from the fuse circuit and then outputs the address for defect relief and an operation that verifies whether the address for defect relief has been correctly set in the fuse circuit.

6. A memory module complying with an FB-DIMM standard, comprising:
    a plurality of semiconductor memories wherein
    each of the semiconductor memories comprising:
        a command decoding section that decodes a command to start a read mode in which stored data is output or a command to start a test mode in which a predetermined circuit operation is executed and then an execution result of the predetermined circuit operation is output;
        a signal generating section that, based on the command decoded by the command decoding section, generates a first data strobe signal showing an output timing of the stored data or a second data strobe signal showing an output timing of the execution result of the predetermined circuit operation; and
        a data-strobe-signal outputting section that outputs the first data strobe signal to an external terminal in the read mode and that outputs the second data strobe signal to the external terminal in the test mode.

7. The memory module as recited in claim 6, wherein the data-strobe-signal outputting section comprises an arithmetic section that calculates a logical OR of the first data strobe signal and the second data strobe signal.

8. The memory module as recited in claim 6, wherein the data-strobe-signal outputting section comprises a selector that selects either the first data strobe signal or the second data strobe signal in accordance with whether an operation mode is the read mode or the test mode.

9. The memory module as recited in claim 6, further comprising a fuse circuit used to store data that defines a circuit structure of each of the semiconductor memories, wherein the predetermined circuit operation is an operation with which the fuse circuit is involved.

10. The memory module as recited in claim 9, wherein the fuse circuit is used to store an address for defect relief, and the predetermined circuit operation is at least one of an operation that reads the address for defect relief from the fuse circuit and then outputs the address for defect relief and an operation that verifies whether the address for defect relief has been correctly set in the fuse circuit.

* * * * *